United States Patent
Fu et al.

(10) Patent No.: US 12,342,600 B2
(45) Date of Patent: Jun. 24, 2025

(54) TITANIUM-CONTAINING DIFFUSION BARRIER FOR CMP REMOVAL RATE ENHANCEMENT AND CONTAMINATION REDUCTION

(71) Applicant: Taiwan Semiconductor Manufacturing Co., Ltd., Hsinchu (TW)

(72) Inventors: Shih-Kang Fu, Hsinchu (TW); Ming-Han Lee, Hsinchu (TW); Shau-Lin Shue, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 40 days.

(21) Appl. No.: 17/869,702

(22) Filed: Jul. 20, 2022

(65) Prior Publication Data
US 2022/0367244 A1    Nov. 17, 2022

Related U.S. Application Data

(62) Division of application No. 17/083,230, filed on Oct. 28, 2020, now Pat. No. 11,545,389.
(Continued)

(51) Int. Cl.
| | | |
|---|---|---|
| H10D 64/27 | (2025.01) | |
| H01L 21/28 | (2025.01) | |
| H01L 21/768 | (2006.01) | |
| H01L 23/528 | (2006.01) | |
| H01L 23/532 | (2006.01) | |

(Continued)

(52) U.S. Cl.
CPC ..... *H10D 64/517* (2025.01); *H01L 21/28088* (2013.01); *H01L 21/7684* (2013.01); *H01L 21/76846* (2013.01); *H01L 23/5283* (2013.01); *H01L 23/53204* (2013.01); *H01L 23/5329* (2013.01); *H10D 30/024* (2025.01); *H10D 30/6211* (2025.01); *H10D 64/017* (2025.01); *H10D 64/667* (2025.01); *H10D 30/792* (2025.01); *H10D 30/797* (2025.01); *H10D 62/822* (2025.01); *H10D 64/691* (2025.01)

(58) Field of Classification Search
CPC ......... H01L 21/76877; H01L 21/76898; H01L 21/76843; H01L 23/481; H01L 23/5226; H01L 23/485; H10D 64/517; H10D 64/667; H10D 64/017; H10D 30/6211; H10D 30/024
See application file for complete search history.

(56) References Cited

U.S. PATENT DOCUMENTS

| | | | | |
|---|---|---|---|---|
| 4,965,656 A | * | 10/1990 | Koubuchi | ............ H01L 29/456 |
| | | | | 438/653 |
| 5,892,286 A | | 4/1999 | Toyoda et al. | |

(Continued)

*Primary Examiner* — Zandra V Smith
*Assistant Examiner* — John M Parker
(74) *Attorney, Agent, or Firm* — Seed IP Law Group (57) ABSTRACT

A semiconductor device is provided. The semiconductor device includes a dielectric layer over a substrate and a contact structure embedded in the dielectric layer. The contact structure includes a diffusion barrier contacting the dielectric layer, the diffusion barrier including a titanium (Ti)-containing alloy. The contact structure further includes a liner on the diffusion barrier, the liner including a noble metal. The contact structure further includes a conductive plug on the liner.

20 Claims, 10 Drawing Sheets

Related U.S. Application Data

(60) Provisional application No. 62/953,109, filed on Dec. 23, 2019.

(51) Int. Cl.
*H10D 30/01* (2025.01)
*H10D 30/62* (2025.01)
*H10D 30/69* (2025.01)
*H10D 62/822* (2025.01)
*H10D 64/01* (2025.01)
*H10D 64/66* (2025.01)
*H10D 64/68* (2025.01)

(56) References Cited

U.S. PATENT DOCUMENTS

| | | | |
|---|---|---|---|
| 6,181,012 B1 * | 1/2001 | Edelstein | H01L 23/53238 |
| | | | 257/E21.585 |
| 2003/0047710 A1 | 3/2003 | Babu et al. | |
| 2004/0077183 A1 * | 4/2004 | Chung | C23C 16/34 |
| | | | 438/785 |
| 2006/0273372 A1 | 12/2006 | Voldman et al. | |
| 2014/0131883 A1 | 5/2014 | Huang et al. | |
| 2017/0229562 A1 | 8/2017 | Katou | |
| 2019/0198444 A1 | 6/2019 | Amanapu et al. | |
| 2019/0221477 A1 * | 7/2019 | Amanapu | H01L 21/7684 |
| 2020/0040221 A1 | 2/2020 | Chih et al. | |
| 2020/0190247 A1 | 6/2020 | Oshita et al. | |

\* cited by examiner

TITANIUM-CONTAINING DIFFUSION BARRIER FOR CMP REMOVAL RATE ENHANCEMENT AND CONTAMINATION REDUCTION

PRIORITY CLAIM AND CROSS-REFERENCE

This application is a divisional of U.S. patent application Ser. No. 17/083,230 filed Oct. 28, 2020 which claims the benefit of U.S. Provisional Patent Application No. 62/953,109, filed Dec. 23, 2019, which is incorporated by reference herein.

BACKGROUND

Integrated circuits (ICs) contain numerous devices such as transistors, diodes, capacitors and resistors that are fabricated on and/or in a semiconductor substrate. These devices are initially isolated from one another and are later interconnected to form functional circuits. As device densities in integrated circuits increase, multiple wiring levels are required to achieve interconnections of these devices. Chemical mechanical polishing (CMP) is commonly used in the formation of multilevel interconnect structures.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a multilevel interconnect structure, conductive lines (e.g., copper (Cu) lines) are laid in stacked dielectric layers and are connected through vias from one layer to another layer. The conductive lines and vias are fabricated using a single or dual damascene process in some instances. In a typical damascene process, a dielectric layer is deposited on a substrate and the dielectric layer is etched in accordance with a mask pattern which corresponds to both the desired via pattern and the desired line pattern. A diffusion barrier layer is deposited on the dielectric layer and in etched areas in the dielectric layer, followed by depositing a liner layer on the diffusion barrier layer. The etched areas are then filled with a conductive metal such as copper. The diffusion barrier layer prevents the conductive metal from diffusion into the dielectric layer and the semiconductor substrate to cause device reliability issues. The choice of the diffusion barrier layer includes tantalum and/or tantalum nitride. The liner layer includes ruthenium (Ru) that has good adhesion to the conductive metal. The liner layer thereby provides a surface upon which the conductive metal nucleates, enabling a conductive metal such as copper to be deposited over by electrochemical plating (ECP).

Once the etched areas are filled, a CMP process is used to remove excess conductive metal and excess portions of the diffusion barrier and liner layers from a top surface of the dielectric layer, thereby forming isolated conductive contact structures in the dielectric layer. The CMP process is carried out by polishing a substrate surface against a polishing pad as a slurry containing both abrasive particles and reactive chemicals is applied to the polishing pad. The relative movement of the polishing pad and the substrate coupled with the reactive chemicals in the slurry allows the CMP process to planarize the substrate surface by means of both physical and chemical forces. During the CMP process, an oxidizing agent, such as hydrogen peroxide, in the slurry aids in oxidizing of a substrate metal layer to its corresponding oxides; thereafter, the metal oxide is mechanically polished and removed with the polishing pad.

Ru as a barrier material for interconnect structures helps to enlarge metal gap-fill window. However, Ru is a noble metal, and because of the chemical and mechanical stability of Ru, contact structures containing Ru metal generally are difficult to polish. The low polishing rate of Ru requires using a relatively strong oxidizer such as ceric ammonium nitrate, sodium periodate ($NaIO_4$), potassium periodate ($KIO_4$), potassium permanganate ($KMnO_4$), etc., and/or a long polishing time and high polishing pressure in order to adequately polishing Ru. These harsh conditions required for Ru CMP result in over-removal of the conductive metal adjacent to Ru, resulting in dishing of the conductive metal. Further, oxidation of Ru by relatively mild oxidizer, hydrogen peroxide, forms ruthenium dioxide ($RuO_2$), which is insoluble in water, a common solvent for the CMP slurry. $RuO_2$ thus is difficult to be removed after being grinded off the polished surface, causing defects on the patterned surface.

The present disclosure provides a titanium (Ti)-containing diffusion barrier layer for use in interconnect structures for enhancing Ru CMP removal rate and reducing polishing by-product, such as $RuO_2$, contamination when Ru is used as a liner layer over the diffusion barrier layer to facilitate deposition of conductive metal, for example, Cu. Using a Ti element-containing diffusion barrier allows performing Ru CMP using a CMP slurry containing a relatively mild oxidizing agent such as, for example, hydrogen peroxide. Hydrogen peroxide in the CMP slurry can oxidize Ti to, for example, titanium hydroperoxide (TiOOH). TiOOH is a stronger oxidizing agent than hydrogen peroxide, and can oxidize $RuO_2$ into a high valence Ru water soluble compound, such as $RuO_4^-$ (if an acidic CMP slurry (e.g., pH<5) is used, or $RuO_4^{2-}$ if a basic CMP slurry (e.g., pH>9) is used. The high valence Ru water soluble compound can be dissolved in the aqueous CMP slurry and be easily removed along with the CMP slurry. As a result, issues related to Ru low removal rate and $RuO_2$ by-product contamination are resolved.

Figure 1:
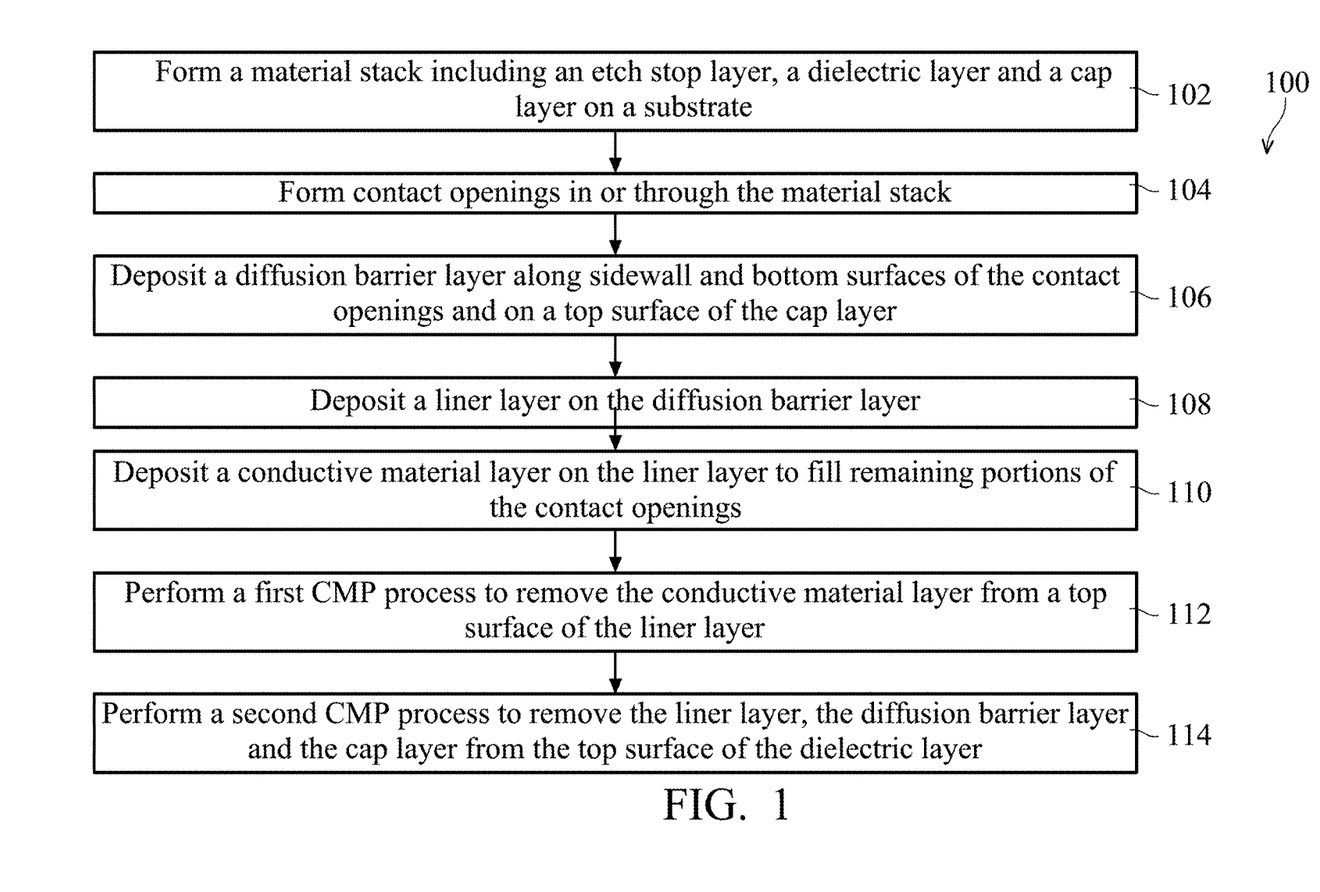
FIG. 1 is a flowchart of a method of fabricating a semiconductor device, in accordance with some embodiments.

FIG. 1 is a flowchart of a method 100 of fabricating a semiconductor device 200, in accordance with some embodiments. FIGS. 2-10 are cross-sectional views of the semiconductor device 200 in various stages of the method 100, in accordance with some embodiments. The method 100 is discussed in detail below, with reference to the semiconductor device 200, in FIGS. 2-10. In some embodiments, additional operations are performed before, during, and/or after the method 100, or some of the operations described are replaced and/or eliminated. In some embodiments, additional features are added to the semiconductor device 200. In some embodiments, some of the features described below are replaced or eliminated. One of ordinary skill in the art would understand that although some embodiments are discussed with operations performed in a particular order, these operations may be performed in another logical order.

Figure 2:
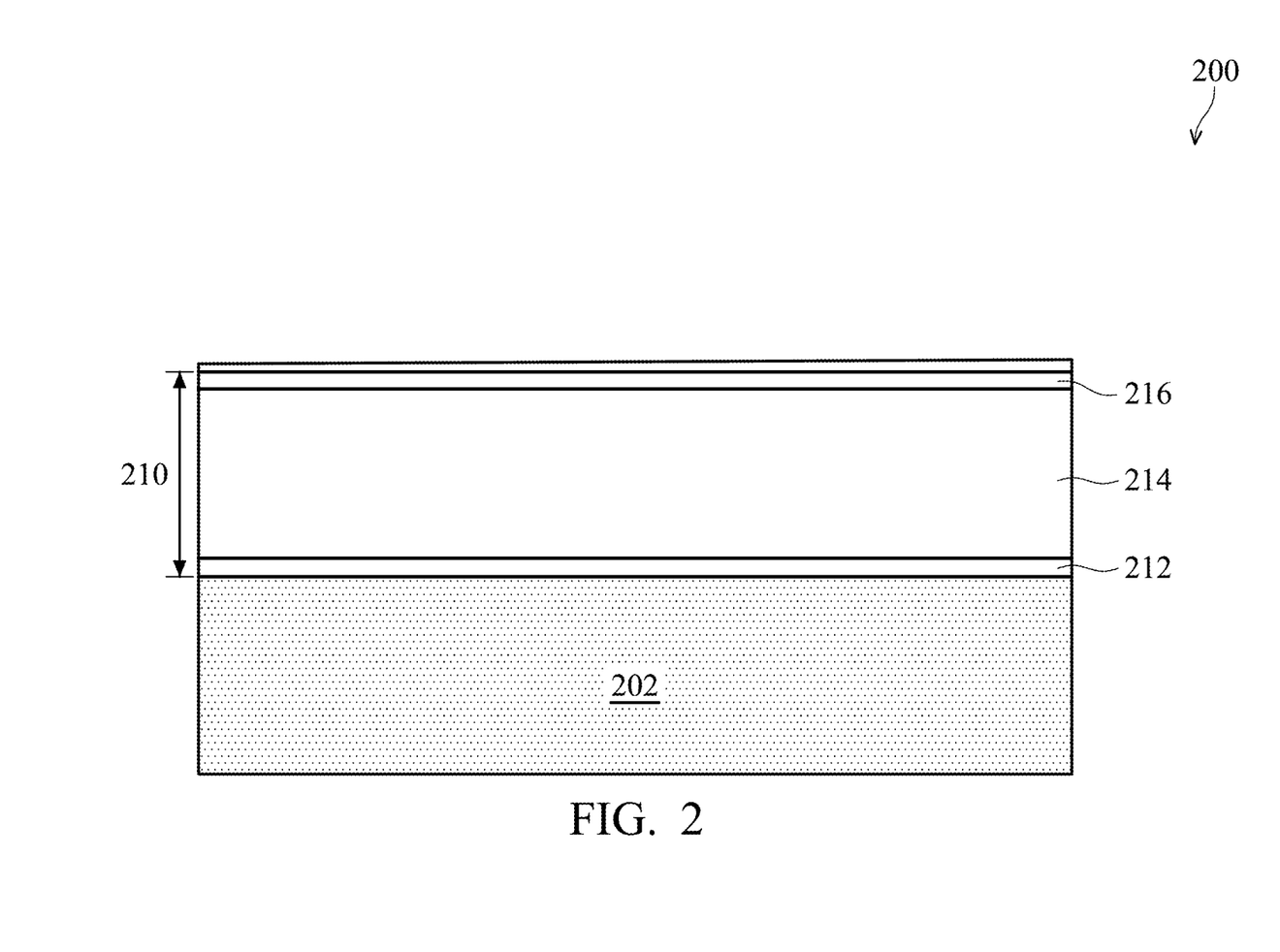
FIGS. 2-10 are cross-sectional views of a semiconductor device in various stages of the method of FIG. 1, in accordance with some embodiments.

Referring to FIGS. 1 and 2, the method 100 includes operation 102, in which a material stack 210 is formed on a substrate 202, in accordance with some embodiments. FIG. 2 is a cross-sectional view of a semiconductor device 200 after forming the material stack 210 on the substrate 200.

In some embodiments and as in FIG. 2, the material stack 210 includes an etch stop layer 212, a dielectric layer 214, and a cap layer 216.

In some embodiments, the substrate 202 includes a semiconductor substrate. In some embodiments, the semiconductor substrate is a bulk semiconductor substrate or a semiconductor-on-insulator (SOI) substrate, or the like. The semiconductor substrate may be doped (e.g., with a p-type or an n-type dopant) or undoped. In some embodiments, the semiconductor substrate includes an elemental semiconductor like silicon (Si) or germanium (Ge), a compound semiconductor like gallium arsenide (GaAs), gallium phosphide (GaP), indium phosphide (InP), indium arsenide (InAs) or indium antimonide (InSb), an alloy semiconductor like SiGe, or combinations thereof. In some embodiments, the semiconductor substrate includes an epitaxial layer.

Various devices may be on the semiconductor substrate. For example, the semiconductor substrate may include field effect transistors (FETs), such as Fin FETs (FinFETs), planar FETs, vertical gate all around FETs (GAA FETs), or the like; diode, capacitors; inductors; and other devices. Devices may be formed wholly within the semiconductor substrate, in a portion of the semiconductor substrate and a portion of one or more overlying layers, and/or wholly in one or more overlying layers, for example. Processing described herein may be used to form contacts to the devices and/or to interconnect the devices to form an integrated circuit. The integrated circuit can be any circuit, such as an Application Specific Integrated Circuit (ASIC), a processor, memory, or other circuits.

The etch stop layer 212 is formed on the substrate 202. In some embodiments and as in FIG. 2A, the etch stop layer 212 is deposited directly above and in contact with the substrate 202. In some embodiments, one or more dielectric layers containing contact structures therein are disposed between the etch stop layer 212 and the substrate 202. The etch stop layer 212 prevents the substrate 202 from being damaged by a subsequent etching step and simultaneously prevents the substrate 202 from being oxidized by exposure to an oxygen containing environment. In some embodiments, the etch stop layer 212 includes silicon nitride (SiN), silicon carbine (SiC), silicon carbon nitride (SiCN), oxygen-doped silicon carbide (SiC:O, also known as ODC), aluminum oxide ($AlO_x$), aluminum oxynitride ($AlO_xN$), or other appropriate materials. In some embodiment, the etch stop layer 212 is deposited on the substrate 202 using a deposition process such as, for example, chemical vapor deposition (CVD), plasma enhanced chemical vapor deposition, or atomic layer deposition (ALD). In some embodiments, the etch stop layer 212 that is formed has a thickness ranging from about 2 nm to about 10 nm. If the thickness of the etch stop layer 212 is too small, there may be incomplete coverage of the substrate 202 and the effect of protecting the underlying substrate 202 may not be achieved, in some instances. If the thickness of etch stop layer 212 is too great, the effect of protecting the underlying substrate 202 does not change, but the cost rises in some instances. The etch top layer 212 is optional and is omitted in some embodiments.

The dielectric layer 214 is formed on the etch stop layer 212. In some embodiments, the dielectric layer 214 includes silicon oxide. In some embodiments, the dielectric layer 214 includes a low-k dielectric material having a dielectric constant (k) less than 4. In some embodiments, the low-k dielectric material has a dielectric constant from about 1.2 to about 3.5. In some embodiments, the dielectric layer 214 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the dielectric layer 214 is deposited, using a deposition process such as, for example, CVD, PECVD, physical vapor deposition (PVD), or spin coating. In some embodiments, the dielectric layer 214 is planarized by a planarization process or otherwise recessed to provide a planar top surface. In some embodiments, the top surface of the dielectric layer 214 is planarized using CMP.

The cap layer 216 is formed on the dielectric layer 214. In some embodiments, the cap layer 216 protects the dielectric layer 214 during subsequent etching processes. In some embodiments, the cap layer 216 also function as an anti-reflective coating layer to suppress unintended light reflection during a subsequent photolithography process. In some embodiments, the cap layer 216 includes silicon dioxide, silicon nitride, silicon oxtnitride, or ODC. In some embodiments, the cap layer 216 is deposited, for example, using CVD, PECVD, ALD, or other suitable deposition processes. In some embodiments, the cap layer 216 that is formed has a thickness ranging from about 5 nanometer (nm) to about 20 nm. If the thickness of the cap layer 216 is too small, there may be incomplete coverage of the dielectric layer 214 and the protection to the dielectric layer 214 may not be achieved, in some instances. If the thickness of cap layer 216 is too great, the effect of protecting the underlying dielectric layer 214 does not change but the cost rises, in some instances. The cap layer 216 is optional and is omitted in some embodiments.

Figure 3:
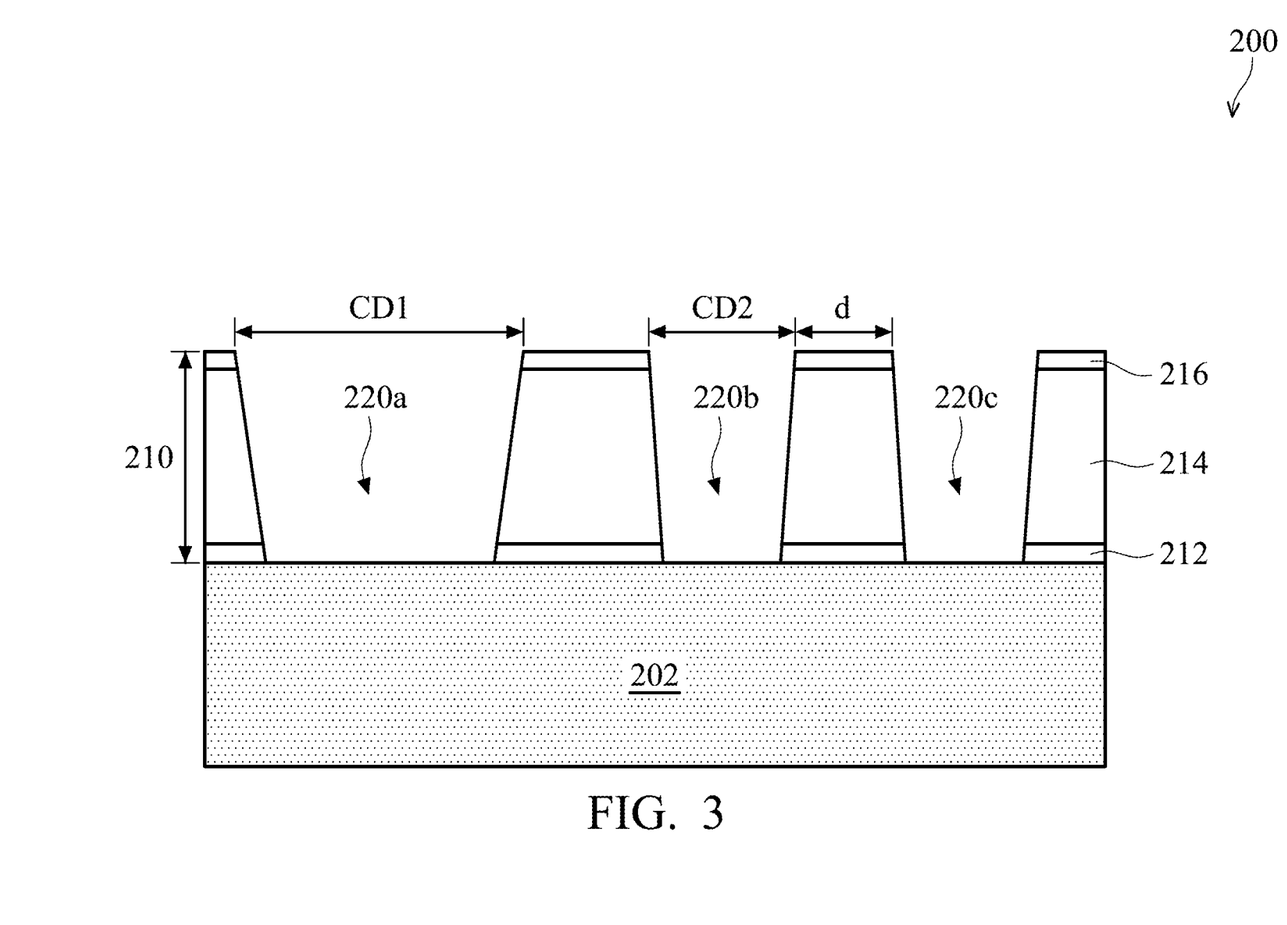

Referring to FIGS. 1 and 3, the method 100 proceeds to operation 104, in which a plurality of contact openings 220a-220c is formed in or through the material stack 210, in accordance with some embodiments. FIG. 3 is a cross-sectional view of the semiconductor device 200 of FIG. 2 after etching the contact openings 220a-220c in or through the material stack 210. Although three contact openings 220a, 220b and 220c are illustrated and described, any numbers of contact openings are contemplated.

Each of the contact openings 220a-220c may be a trench, a via, or a combination of a trench and a via with the via beneath and enclosed by the trench. In some embodiments and as in FIG. 3, the contact opening 220a-220c are trenches. The contact openings 220a-220c are aligned to expose underlying conductive features in the substrate 202 such as metal lines in a lower metallization layer or alternatively doped regions disposed in the semiconductor substrate of the substrate 202. In some embodiments, the contact openings 220a-220c are formed to have a uniform critical dimension (not shown). Alternatively, in some embodiments, the contact openings 220a-220b are formed to have different critical dimensions. For example, the critical dimension CD1 of the contact opening 220a can be from about 50 nm to about 1 µm, and the critical dimension CD2 of the contact opening 220b can be from about 10 nm to about 40 nm. The spacing d between adjacent contact openings 220a-220c can be from about 10 nm to about 1 micrometer (µp). The depth of the contact openings 220a-220c can be from about 15 nm to about 80 nm.

In some embodiments, the contact openings 220a-220c are formed using photolithography and etching processes, such as a single or dual damascene process. In some embodiments, a photoresist layer (not shown) is first applied over the cap layer 216 by, for example, spin coating. The photoresist layer is then exposed to UV radiation. Exposed or unexposed portion of the photoresist layer are then removed depending on whether a negative or positive resist is used, creating a patterned photoresist layer having openings therein (not shown). The patterned photoresist layer exposes portions of the cap layer 216 where the contact openings 220a-220c are to be formed. Once the patterned photoresist is formed, one or more anisotropic etches are performed to portions of the cap layer 216, the dielectric layer 214 and the etch stop layer 212 that are not covered by the patterned photoresist layer, forming the contact openings 220a-220c. The anisotropic etch can be a dry etch such as, for example, a reactive ion etch (ME) or a plasma etch, a wet etch, or a combination thereof. In some embodiments, a single anisotropic etch is performed to etch the cap layer 216, the dielectric layer 214, and the etch stop layer 212. Alternatively, multiple anisotropic etches are performed. For example, a first anisotropic etch is performed to etch unmasked portions of the cap layer 216, a second anisotropic etch is performed to etch the unmasked portions of dielectric layer 214, and a third anisotropic etch is performed to tech the unmasked portions of the etch stop layer 212. After formation of the contact openings 220a-220c, the patterned photoresist layer is removed, for example, by wet stripping or plasma ashing.

Figure 4:
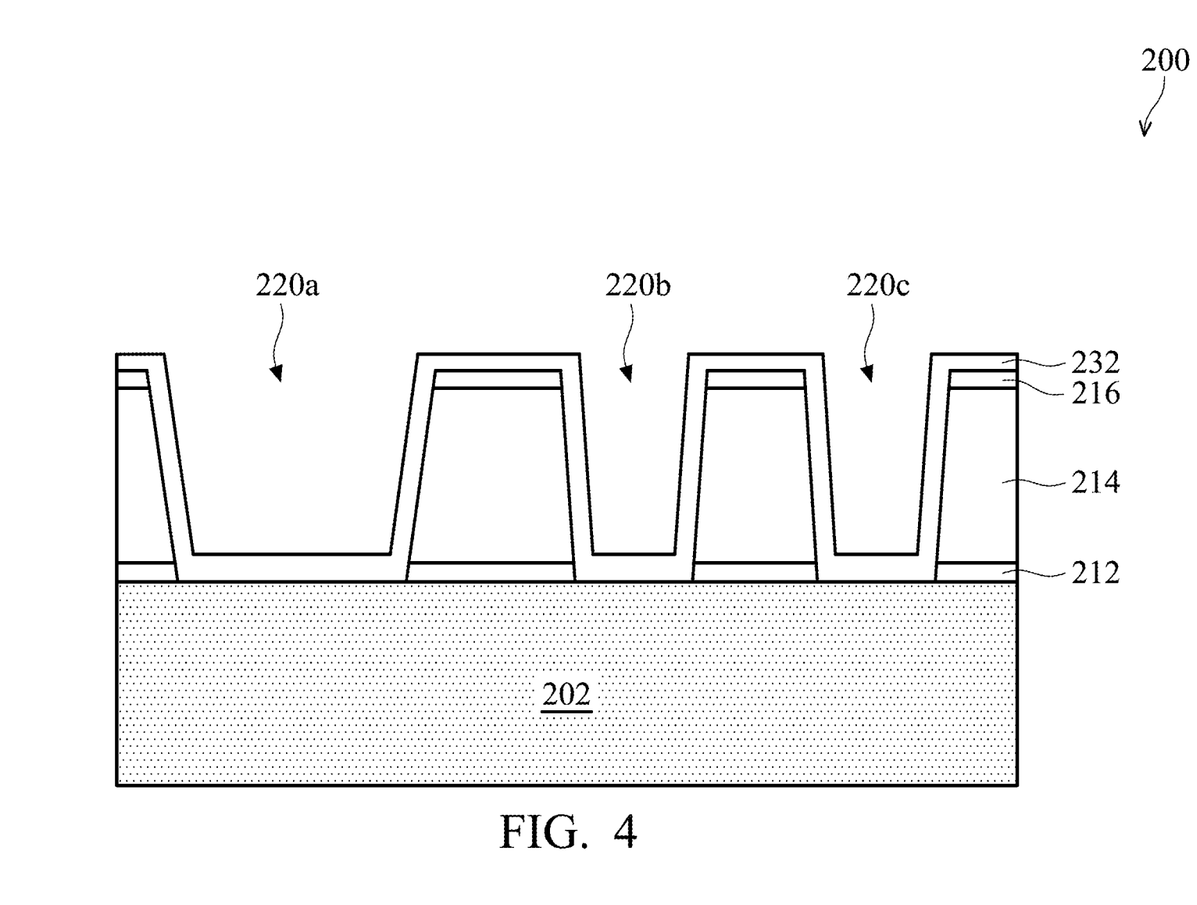

Referring to FIGS. 1 and 4, the method 100 proceeds to operation 106, in which a diffusion barrier layer 232 is deposited along sidewall and bottom surfaces of the contact openings 220a-220c and on a top surface of the cap layer 216, in accordance with some embodiments. FIG. 4 is a cross-sectional view of the semiconductor device 200 of FIG. 3 after depositing the diffusion barrier layer 232 along sidewall and bottom surfaces of the contact openings 220a-220c and on a top surface of the cap layer 216.

The diffusion barrier layer 232 prevents metal in a conductive material layer subsequently formed from diffusing into the dielectric layer 214 and the substrate 202. In some embodiments and as in FIG. 4, the diffusion barrier layer 232 has a single layer structure and includes a titanium (Ti)-containing alloy. In some embodiments, the diffusion barrier layer 232 includes $Ti_xTa_yN_z$, $Ti_xW_yN_z$, $Ti_xMo_yN_z$, $Ti_xMn_yN_y$, $Ti_xCo_yN_y$, $Ti_xCo_yTa_z$, $Ti_xTa_ySiN_z$, or combinations thereof. Each value of x is independently from 2 to 5, each value of y is independently from 1 to 5, and each value of z is independently from 1 to 4. In some other embodiments, the diffusion barrier layer 232 is a single layer that is made of substantially pure titanium. In some embodiments, the diffusion barrier layer 232 is deposited utilizing a conformal deposition process such as, for example, CVD, PVD, or ALD. The thickness of the diffusion barrier layer 232 that is formed is from about 10 Angstrom (Å) to about 30 Å. If the thickness of the diffusion barrier layer 232 is too small, the effect of preventing metal diffusion is not achieved, in some instances. If the thickness of the diffusion barrier layer 232 is too great, the effect of preventing metal diffusion does not change but the metal filing process window is decreased, in some instances.

Figure 5:
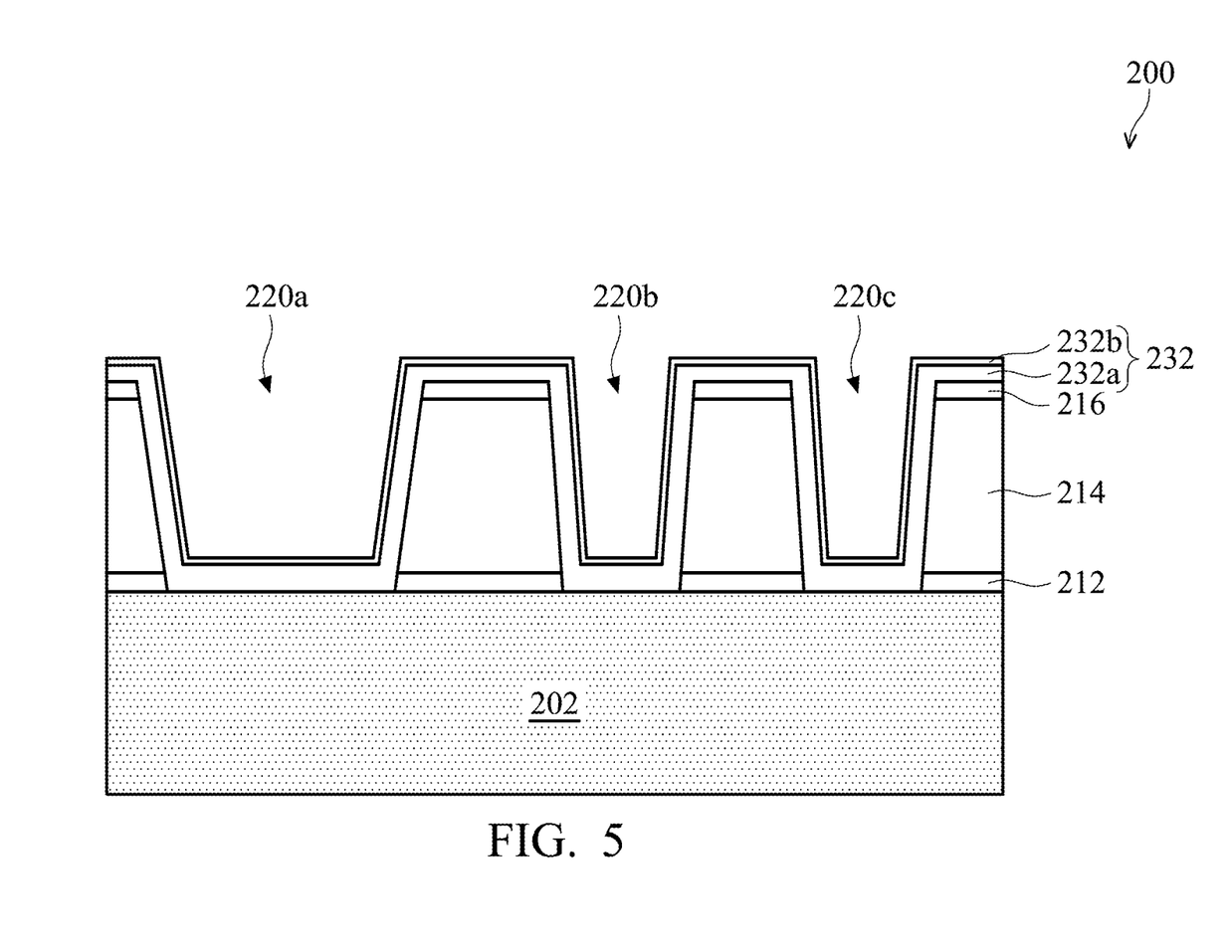

In alternative embodiments and as in FIG. 5, the diffusion barrier layer 232 has a bi-layer structure and includes a first diffusion barrier layer 232a lining the contact openings 220a-220c and a second diffusion barrier layer 232b on the first diffusion barrier layer 232a. In some embodiments, the first diffusion barrier layer 232a includes a metal nitride. Exemplary metal nitrides that can be employed in the first diffusion barrier layer 232a include, but are not limited to, TaN, TiN, WN, MoN, MnN, and TaSiN. The second diffusion barrier layer 232b includes Ti. In some embodiments, the second diffusion barrier layer 232b is made of substantially pure titanium. In some other embodiments, the second diffusion barrier layer 232b is made of or includes a titanium-containing alloy such as TiCo, TiMn, or TiNi. In some embodiments, the first diffusion barrier layer 232a is deposited using, for example, ALD, CVD, or PVD, and the second diffusion barrier layer 232b is deposited using, for example, ALD or CVD. In some embodiments, the thickness of the first diffusion barrier layer 232a that is formed is from about 5 Å to about 15 Å, and the thickness of the second diffusion barrier layer 232b that is formed is from about 5 Å to about 15 Å.

Figure 6:
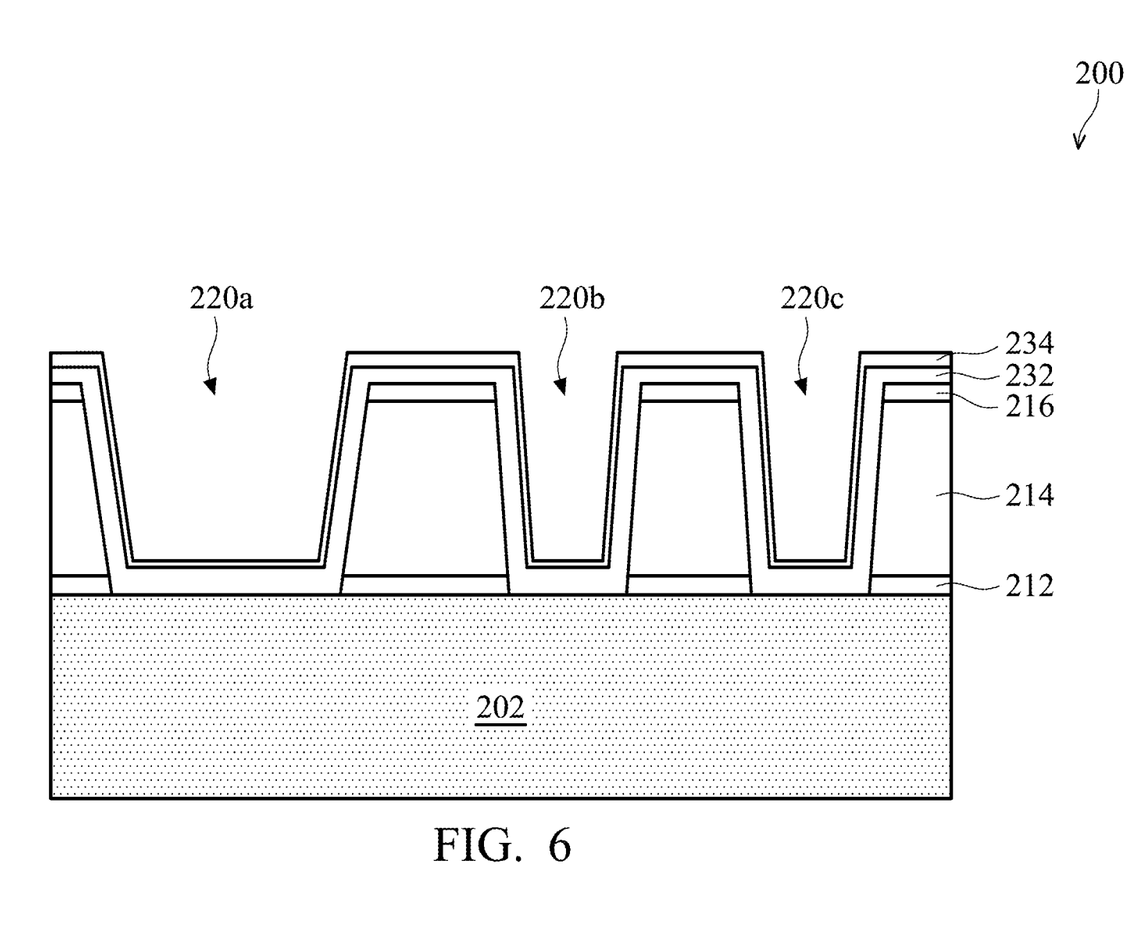

Referring to FIGS. 1 and 6, the method 100 proceeds to operation 108, in which a liner layer 234 is deposited on the diffusion barrier layer 232, in accordance with some embodiments. FIG. 6 is a cross-sectional view of the semiconductor device 200 of FIG. 4 after depositing the liner layer 234 on the diffusion barrier layer 232.

The liner layer 234 enhances adhesion between the diffusion barrier layer 232 and the conductive material layer subsequently formed thereon. In some embodiments, the liner layer 234 includes a noble metal such as, for example, Ru, indium (In), or osmium (Os). In some embodiments, the liner layer 234 is deposited using a conformal deposition process such as, for example, CVD or ALD. The thickness of the liner layer 234 that is formed is from about 5 Å to about 35 Å. If the thickness of the liner layer 234 is too small, the effect of promoting adhesion is not achieved, in some instances. If the thickness of the liner layer 234 is too great, the effect of promoting adhesion does not change but the metal filing process window is decreased, in some instances.

Figure 7:
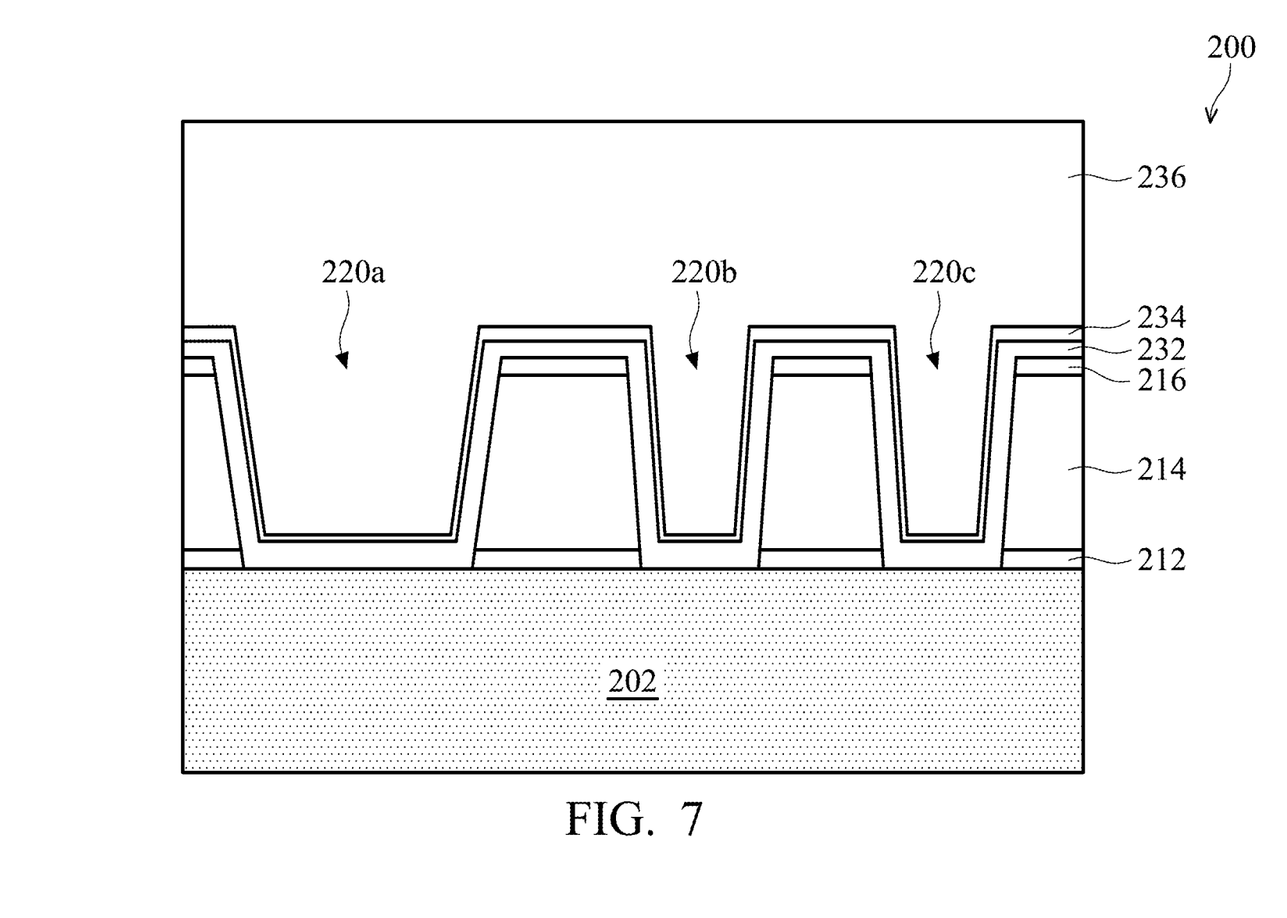

Referring to FIGS. 1 and 7, the method 100 proceeds to operation 110, in which a conductive material layer 236 is deposited on the liner layer 234 to fill remaining portions of the contact openings 220a-220c, in accordance with some embodiments. FIG. 7 is a cross-sectional view of the semiconductor device 200 of FIG. 6 after depositing the conductive material layer 236 on the liner layer 234 to fill remaining portions of the contact openings 220a-220c.

In some embodiments, the conductive material layer 236 includes a conductive metal such as, for example, Cu, Al, Co, W, Al, Ag, combination thereof, or alloys thereof. In some embodiments, the conductive material layer 236 is deposited by a suitable deposition process such as, for example, CVD, PECVD, sputtering, or electroplating. The deposition process is continued until the conductive material layer 236 overfills the contact openings 220a-220c so that the conductive material layer 236 covers a top surface of the liner layer 234. In some embodiments and as in FIG. 7, after deposition, the top surface of the conductive material layer 236 is higher than the liner layer 234, by about 400 nm to about 700 nm.

Figure 8:
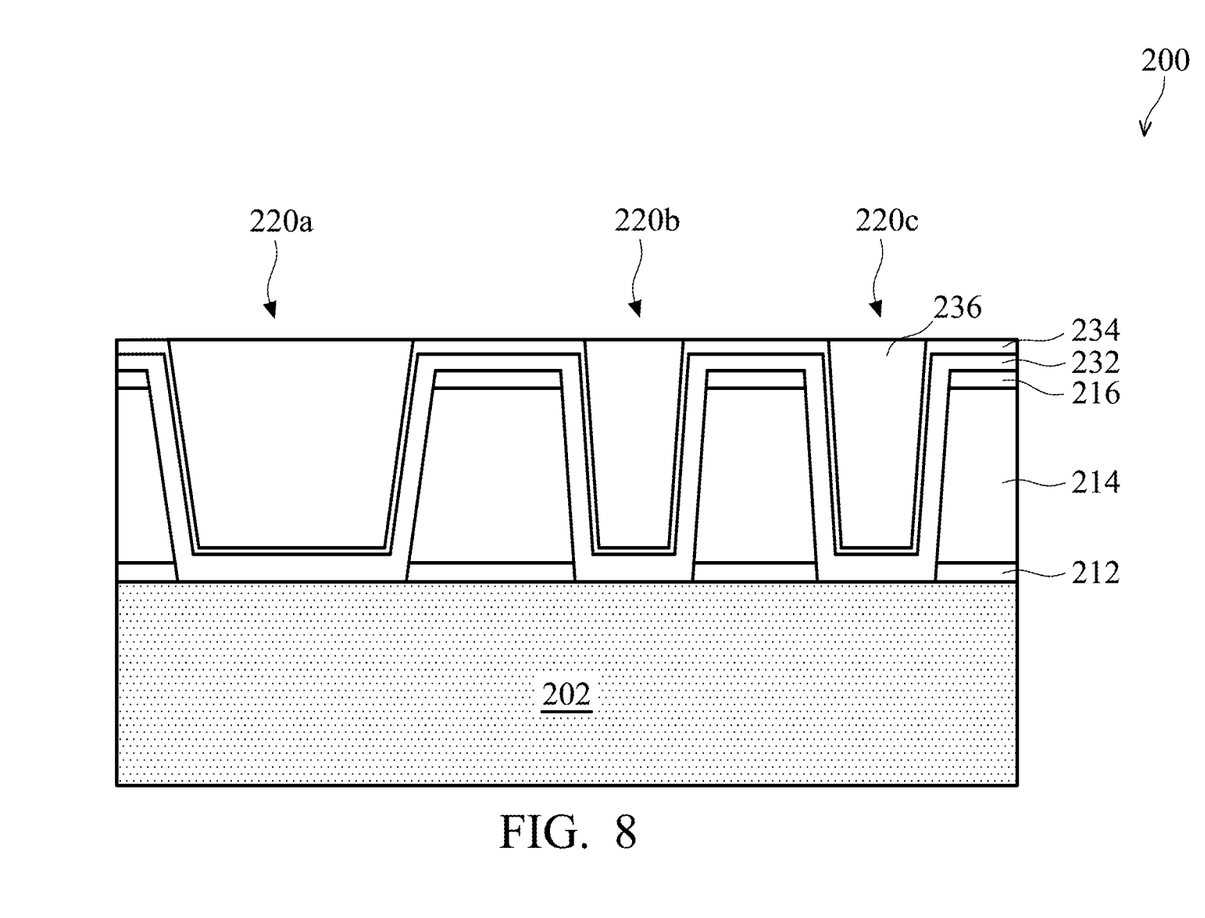

Referring to FIGS. 1 and 8, the method 100 proceeds to operation 112, in which a first CMP process is performed to remove the conductive material layer 236 from a top surface of the liner layer 234, in accordance with some embodiments. FIG. 8 is a cross-sectional view of the semiconductor device 200 of FIG. 7 after removing the conductive material layer 236 from the top surface of the liner layer 234.

The first CMP stops on the liner layer 234 such that after the first CMP process, the top surface of the liner layer 234 is exposed.

The first CMP process is performed using a first CMP slurry with a high polishing selectivity between the conductive material layer 236 and the liner layer 234. The first CMP slurry thus removes the conductive material layer 236 from the top of the liner layer 234, while the liner layer 234 is intact. In some embodiments, the first CMP slurry includes abrasive particles dispersed in an aqueous solvent such as water. The abrasive particles mechanically polishes the conductive material layer 236. Examples of abrasive particles include, but are not limited to, colloidal silica, fume silica, and ceria. The abrasive particles are stabilized with a surfactant. Examples of surfactants include, but are not limited to, alkyl sulfates, carboxylates, and alkyl phosphates having carbon backbones in the range of from C10 to C14. The first CMP slurry further uses an oxidizing agent, a corrosion inhibitor and a buffer. The oxidizing agent is used to oxide the metal in the conductive material layer 236 into its corresponding oxide, for example, copper to cuprous oxide or cupric oxide so that the conductive material layer 236 can be easily removed by mechanical abrasion. In some embodiments, a relatively milder oxidizer such as hydrogen peroxide is used. The corrosion inhibitor is used to prevent corrosion of metal during the first CMP process. In some embodiments, the corrosion inhibitor includes benzotriazole. The buffer is used to maintain a pH level of the first CMP slurry in a range from about 6 to about 8. Examples of the pH buffers include, but are not limited to, citric acid and potassium citrate, acetic acid and potassium citrate, and phosphoric acid and potassium phosphate.

The first CMP slurry is applied to a polishing pad contained on a platen or directly dispensed onto the surface to be polished. Polishing parameters such as down force, slurry flow rate, table speed, head speed, and pad type are adjusted to effect the results of the first CMP slurry. In some embodiments, the down force is in a range from about 0.5 psi to about 2 psi, the table speed is in a rage from about 30 to about 100 revolution per minute (rpm), and the head speed is in a range of from about 20 rpm to about 90 rpm. The polishing end point is monitoring by measuring eddy current or optical reflection from the surface being polished.

Figure 9:
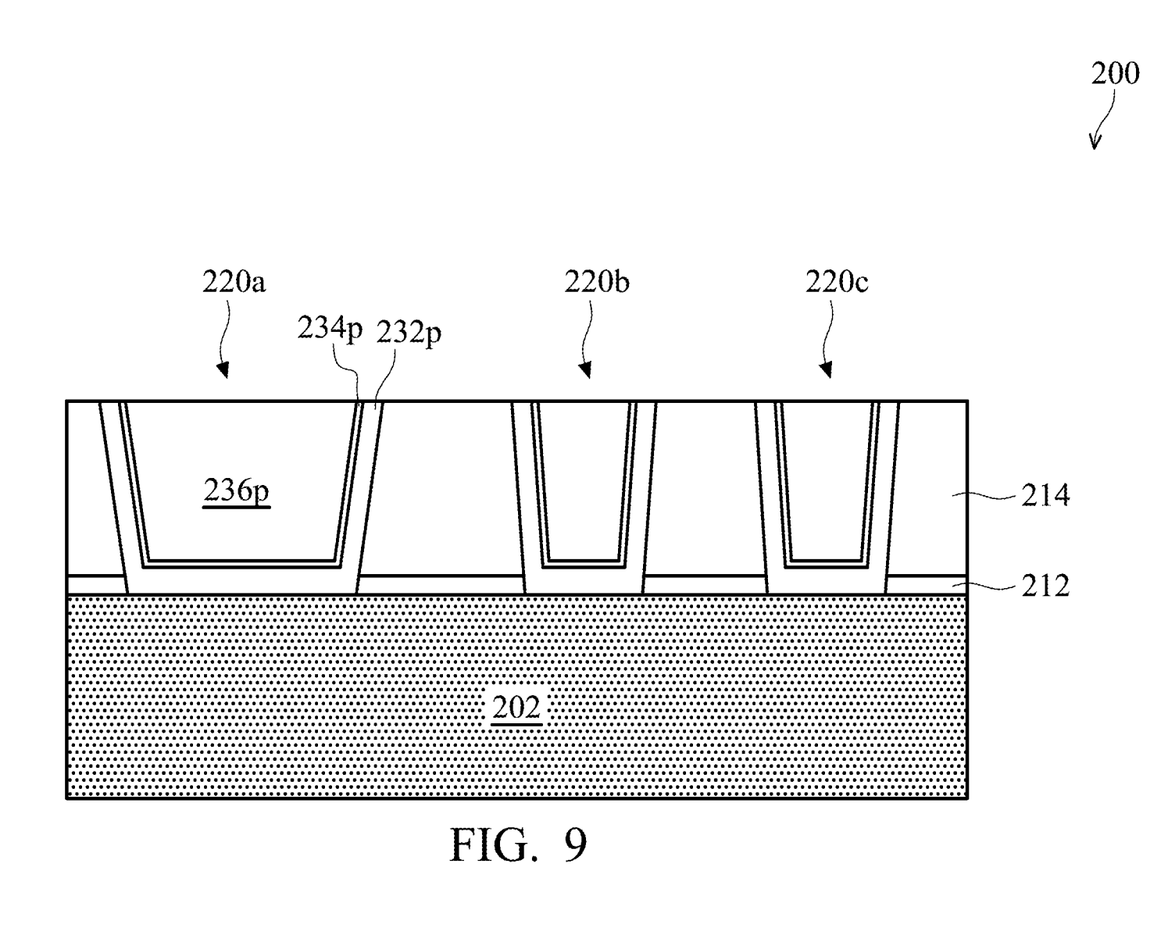

Referring to FIGS. 1 and 9, the method 100 proceeds to operation 114, in which a second CMP process is performed to remove the liner layer 234, the diffusion barrier layer 232, and the cap layer 216 from the top surface of the dielectric layer 214, in accordance with some embodiments. The second CMP process also removes the conductive material in the contact openings 220a-220c such that after the CMP process, the conductive material layer 214 has a top surface coplanar with the dielectric layer 214. FIG. 9 is a cross-sectional view of the semiconductor device 200 of FIG. 8 after removing the liner layer 234 and the diffusion barrier layer 232 from the top surface of the cap layer 216.

The second CMP process results in a substantially flat surface upon which an upper level interconnect structure is subsequently formed. After the second CMP process, contact structures (232p, 234p, 236p) are formed within the contact openings 220a-220c. Each contact structure (232p, 234p, 236p) includes a diffusion barrier 232p which is a remaining portion of the diffusion barrier layer 232 along sidewall and bottom surface of a corresponding contact opening 220a-220c, a liner 234p which is a remaining portion of the liner layer 234 on the diffusion barrier 232p, and a conductive plug 236p which is a remaining portion of the conductive material layer 236 on the liner 234. The top surfaces of the conductive plug 236, the liner 234p, and the diffusion barrier 232p within each contact opening 220a-220c are coplanar with the top surface of the dielectric layer 214. In some embodiments, the contact structures (232p, 234p, 236p) have a height from about 10 nm to about 60 nm.

Figure 10:
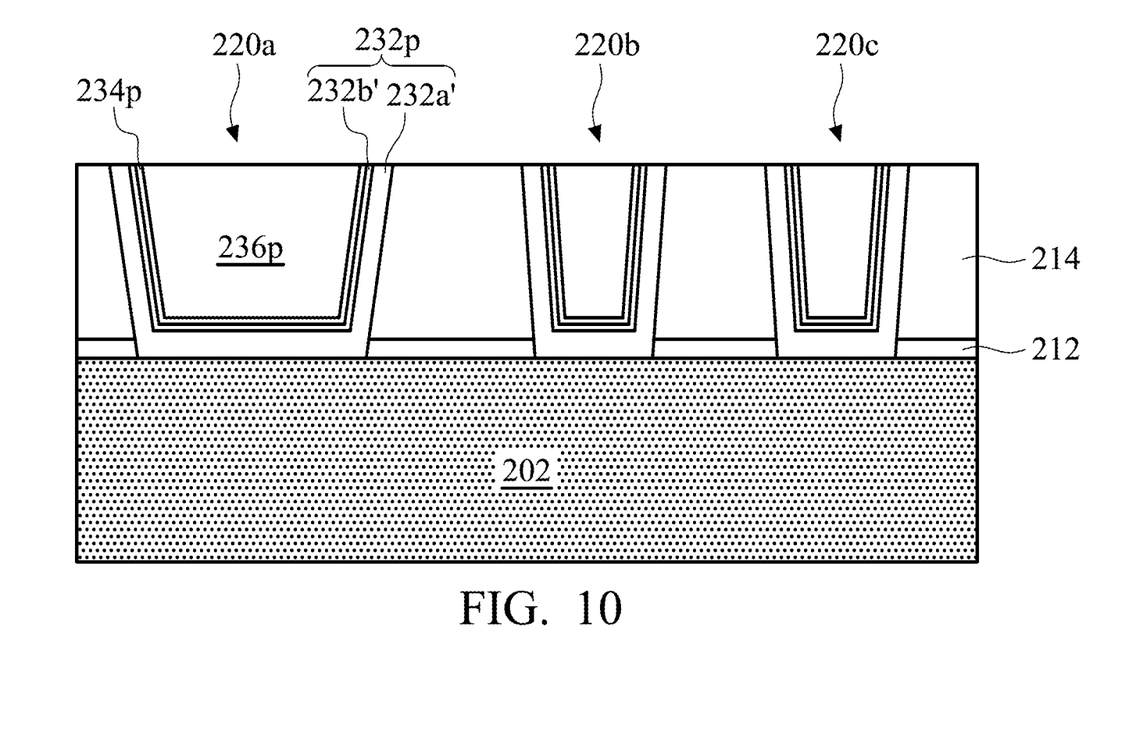

In embodiments where the diffusion barrier layer 232 has a bi-layer structure including a first diffusion barrier layer 232a and a second diffusion barrier layer 232b (FIG. 5), after the second CMP process to form the contact structures within the contact openings 220a-220c, the diffusion barrier 232p within each contact opening 220a-220c has a bi-layer structure including a first diffusion barrier 232a' and a second diffusion barrier 232b', as shown in FIG. 10.

The second CMP process is performed using a second CMP slurry. The second CMP slurry is selected to have a relative high polishing rate to the liner layer 234, the diffusion barrier layer 232, and the cap layer 216, but a relatively low polishing rate to the conductive material layer 236 and the dielectric layer 214. The second CMP slurry is, thus, capable of removing portions of the liner layer 234, the diffusion barrier layer 232, and the cap layer 216 from the top surface of the dielectric layer 214, without over-polishing the conductive material layer 236 within the contact openings 220a-220c and the dielectric layer 214. As a result, the dishing of the resulting conductive plug 236p within each contact opening 220a-220c is prevented. In some embodiments, the second CMP slurry includes abrasive particles, a surfactant, an oxidizing agent, a corrosion inhibitor, and a buffer. The buffer in the second CMP is selected to provide an acidic slurry with a pH from about 2 to about 6 or a basic CMP with a pH from about 9 to about 11.

The second CMP slurry is applied to a polishing pad contained on a platen or directly dispensed onto the wafer to be processed. Polishing parameters such as down force, slurry flow rate, table speed, head speed, and pad type are adjusted to effect the results of the second CMP slurry. In some embodiments, the down force is in a range from about 0.5 psi to about 2.5 psi, the table speed is in a rage from about 30 to about 115 rpm, and the head speed is in a range of from about 25 rpm to about 105 rpm. The polishing end point is detected by eddy current or optical reflection from the polishing surface.

During the second CMP process, hydrogen peroxide oxides metal in the liner layer 234 and Ti element in the diffusion barrier layer 232 to their corresponding oxides, respectively, for example, Ru to $RuO_2$ if the liner layer 234 is composed of Ru, and Ti to $TiO_2$. $TiO_2$ is further oxidized by hydrogen peroxide to form Ti(OOH), which is a stronger oxidizer than hydrogen peroxide. Ti(OOH) oxidizes $RuO_2$ to $RuO_4^-$ when an acidic CMP slurry is used in the second CMP process or $RuO_4^{2-}$ when a basic CMP slurry is used in the second CMP process. In some embodiments, the acidic CMP slurry has a pH<5. In some embodiments, the basic CMP slurry has a pH>9. $RuO_4^-$ and $RuO_4^{2-}$ are water soluble, and thus can be dissolved in the second CMP slurry and easily removed along with the second CMP slurry. Introducing Ti element containing diffusion barrier layer 232 beneath the liner layer 234, thus, helps to reduce defect formation and increase removal rate of the liner layer 234.

One aspect of this description relates to a semiconductor device. In some embodiments, the semiconductor device includes a dielectric layer over a substrate and a contact structure embedded in the dielectric layer. The contact structure includes a diffusion barrier contacting the dielectric layer, the diffusion barrier including a titanium (Ti)-containing alloy. The contact structure further includes a liner on the diffusion barrier, the liner including a noble metal. The contact structure further includes a conductive plug on the liner.

Another aspect of this description relates to a semiconductor device. The semiconductor device includes a dielectric layer over a substrate. The semiconductor device further includes a diffusion barrier on sidewalls and a recessed surface of the dielectric layer. The diffusion barrier includes a first diffusion barrier and a second diffusion barrier on the first diffusion barrier. The second diffusion barrier includes titanium (Ti) or a Ti-containing alloy. The semiconductor device further includes a liner on the diffusion barrier. The liner includes a noble metal. The semiconductor device further includes a conductive plug on the liner.

Still another aspect of this description relates to a method of forming a semiconductor device. The method includes forming a contact opening in a dielectric layer over a substrate. The method further includes depositing a diffusion barrier layer along the opening. The diffusion barrier layer includes a titanium (Ti)-containing alloy. The method further includes depositing a liner layer on the diffusion barrier layer. The liner layer includes a noble metal. The method further includes further includes depositing a conductive material layer to fill the opening. The method further includes performing a first chemical mechanical polishing (CMP) process using a first CMP slurry to remove the conductive material layer from a top surface of the liner layer. The method further includes performing a second CMP process using a second CMP slurry to remove the liner layer and the diffusion barrier layer from a top surface of the dielectric layer. The second CMP slurry comprises hydrogen peroxide as an oxidizing agent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a dielectric layer over a substrate; and
   a contact structure embedded in the dielectric layer, the contact structure comprising:
      a diffusion barrier contacting the dielectric layer, the diffusion barrier comprising a titanium (Ti)-containing compound selected from the group consisting of $Ti_xMo_yN_z$, $Ti_xMn_yN_y$, $Ti_xCo_yN_y$ and, $Ti_xCo_yTa_z$, wherein x is from 2 to 5, y is from 1 to 5, and z is 1 to 4;
      a liner contacting the diffusion barrier, the liner comprising a noble metal; and
      a conductive plug contacting the liner.

2. The semiconductor device of claim 1, wherein the conductive plug comprises Cu, Co, W, Al or Ag.

3. The semiconductor device of claim 1, wherein the noble metal comprises ruthenium (Ru), iridium (Ir) or osmium (Os).

4. The semiconductor device of claim 1, further comprising an etch stop layer between the dielectric layer and the substrate, wherein the contact structure is surrounded by the etch stop layer.

5. The semiconductor device of claim 4, wherein the etch stop layer comprises SiCN, SiC, $SiO_2$, $AlO_x$ or $AlO_xN$.

6. The semiconductor device of claim 1, wherein the dielectric layer comprises tetraethylorthosilicate (TEOS) oxide, undoped silicate glass, or doped silicate glass such as borophosphosilicate glass (BPSG), fluorosilica glass (FSG), phosphosilicate glass (PSG), or boron doped silicon glass (BSG).

7. The semiconductor device of claim 1, wherein the diffusion barrier has a thickness ranging from 10 Angstrom (Å) to about 30 Å.

8. A semiconductor device, comprising:
   a dielectric layer over a substrate;
   a diffusion barrier on sidewalls and a recessed surface of the dielectric layer, the diffusion barrier comprising a first diffusion barrier and a second diffusion barrier on the first diffusion barrier, the first diffusion barrier comprising a first material and the second diffusion barrier comprising a second material different from the first material, wherein the first material is a metal nitride selected from the group consisting of WN, MON and MnN and the second material is a Ti-containing alloy selected from the group consisting of TiCo, TiMn and TiNi;
   a liner contacting the diffusion barrier, the liner comprising a noble metal; and
   a conductive plug contacting the liner.

9. The semiconductor device of claim 8, the first diffusion barrier is made of MON or, MnN.

10. The semiconductor device of claim 8, wherein the noble metal comprises ruthenium (Ru), iridium (Ir) or osmium (Os).

11. The semiconductor device of claim 8, wherein the dielectric layer comprises a low-k dielectric material.

12. The semiconductor device of claim 11, wherein the dielectric layer comprises tetraethylorthosilicate (TEOS)

oxide, undoped silicate glass, or doped silicate glass such as borophosphosilicate glass (BPSG), fluorosilica glass (FSG), phosphosilicate glass (PSG), or boron doped silicon glass (BSG).

13. The semiconductor device of claim 8, wherein the conductive plug comprises Cu, Al, Co, W, Al, Ag, combinations thereof or alloys thereof.

14. A semiconductor device, comprising:
a dielectric layer over a substrate;
an etch stop layer between the dielectric layer and the substrate;
a contact structure embedded in the dielectric layer, the contact structure including:
a diffusion barrier on sidewalls and a recessed surface of the dielectric layer, the diffusion barrier comprising a first diffusion barrier and a second diffusion barrier on the first diffusion barrier, the first diffusion barrier comprising a first material and the second diffusion barrier comprising a second material different from the first material, wherein the first material is a metal nitride selected from the group consisting of WN, MON and MnN and the second material is a Ti-containing alloy selected from the group consisting of TiCo, TiMn and TiNi;
a liner contacting the diffusion barrier, the liner comprising a ruthenium; and
a conductive plug contacting the liner.

15. The semiconductor device of claim 14, wherein the Ti-containing alloy is selected from TiCo and TiMn.

16. The semiconductor device of claim 14, wherein the conductive plug comprises Cu, Co, W, Al or Ag.

17. The semiconductor device of claim 14, wherein the etch stop layer comprises SiCN, SiC, $SiO_2$, $AlO_x$ or $AlO_xN$.

18. The semiconductor device of claim 14 wherein the dielectric layer comprises tetraethylorthosilicate (TEOS) oxide, undoped silicate glass, or doped silicate glass such as borophosphosilicate glass (BPSG), fluorosilica glass (FSG), phosphosilicate glass (PSG), or boron doped silicon glass (BSG).

19. The semiconductor device of claim 14, wherein the first diffusion barrier is made of MON or, MnN.

20. The semiconductor device of claim 14, wherein the first diffusion barrier and the second diffusion barrier independently have a thickness ranging from 5 Å to about 15 Å.

* * * * *